US010193249B2

(12) United States Patent
So et al.

(10) Patent No.: US 10,193,249 B2
(45) Date of Patent: Jan. 29, 2019

(54) CONNECTOR COMPONENT AND RETENTION MECHANISM FOR M.2 FORM FACTOR MODULE

(71) Applicant: Hewlett-Packard Development Company, L.P., Houston, TX (US)

(72) Inventors: Chi So, Spring, TX (US); Robert C Brooks, Houston, TX (US); Bruce Trevino, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/039,762

(22) PCT Filed: Dec. 2, 2013

(86) PCT No.: PCT/US2013/072683

§ 371 (c)(1),
(2) Date: May 26, 2016

(87) PCT Pub. No.: WO2015/084316

PCT Pub. Date: Jun. 11, 2015

(65) Prior Publication Data

US 2017/0005422 A1 Jan. 5, 2017

(51) Int. Cl.
*H05K 5/00* (2006.01)
*H01R 12/70* (2011.01)
(Continued)

(52) U.S. Cl.
CPC ..... *H01R 12/7076* (2013.01); *H01R 12/7005* (2013.01); *H01R 12/737* (2013.01); *H01R 12/718* (2013.01)

(58) Field of Classification Search
CPC ............ H01R 12/7076; H01R 12/7005; H01R 12/737; H01R 12/718
See application file for complete search history.

(56) References Cited

U.S. PATENT DOCUMENTS 8,559,189 B2 * 10/2013 Li ........................... G06F 1/188 361/785
2008/0121706 A1 * 5/2008 Defibaugh ............. G06K 13/08 235/441
(Continued)

FOREIGN PATENT DOCUMENTS

CN 202917665 u 5/2013
JP 2000-299152 A 10/2000

OTHER PUBLICATIONS

Addonics Technologies. Embedded IDE-CF Adapter. 1998-2013 Addonics Technologies, Inc., 2 pages.
(Continued)

*Primary Examiner* — James Wu
*Assistant Examiner* — Hung Dang
(74) *Attorney, Agent, or Firm* — HP Inc. Patent Department

(57) ABSTRACT

In one example in accordance with the present disclosure, a connector component is provided. The connector component includes a first connector portion comprising a plurality of contacts to couple with a printed circuit board, and a second connector portion comprising a plurality of contacts to couple with an M.2 form factor module. The second connector portion is to receive the M.2 form factor module in an upright orientation such that neither a front surface nor a rear surface of the M.2 form factor module substantially faces the printed circuit board. In addition, the second connector portion is to retain the M.2 form factor module in the upright orientation without a retention mechanism external to the connector component.

18 Claims, 7 Drawing Sheets

(51) Int. Cl.

| | |
|---|---|
| ***H01R 12/73*** | (2011.01) |
| *H01R 12/71* | (2011.01) |

(56) References Cited

U.S. PATENT DOCUMENTS

| | | | | |
|---|---|---|---|---|
| 2009/0231798 | A1* | 9/2009 | Skinner ................... | G06F 1/185<br>361/679.31 |
| 2013/0164951 | A1 | 6/2013 | Ma et al. | |
| 2013/0252449 | A1 | 9/2013 | Tang et al. | |
| 2013/0294023 | A1* | 11/2013 | Gay ........................ | G06F 1/187<br>361/679.31 |

OTHER PUBLICATIONS

Heilind Stocking JAE's New M.2 (NGFF) Card Edge Connector : N/A Aug. 22, 2013; http://www.ebnonline.com/document.asp?doc_id=267040.

M.2 (next Generation Form Factor); TE Connectivity Ltd.; May 10, 2013; https://www.google.co.in/url?sa=t&rct=j&q=&esrc=s&source=web&cd=1&cad=rja&ved=0CC0QFjAA&url=http%3A%2F%2.

News Posts matching "NGFF"; Aug. 22, 2013; http://www.ebnonline.com/document.asp?doc_id=267040.

NGFF Spec Promises Smaller SSDs; Gasior, G.; Techreport Com.; Sep. 14, 2012; http://techreport.com/news/23570/ngff-spec-promises-smaller-ssds.

SATA M.2 Card; 2013; https://www.sata-io.org/sata-m2-card.

* cited by examiner

CONNECTOR COMPONENT AND RETENTION MECHANISM FOR M.2 FORM FACTOR MODULE

CROSS-REFERENCE TO RELATED APPLICATION

This application is a national stage application under 35 U.S.C. § 371 of PCT/US2013/072683, filed Dec. 2, 2013.

BACKGROUND

In the computer interface technology space, M.2 (formerly known as the Next Generation Form Factor (NGFF)) is a transition from the mini-SATA (mSATA) and the PCI Express Mini Card (Mini PCIe) form factors to a more advanced farm factor bath in terms of physical size and available features. The interface technology supports various modules including, but not limited to WiFi, Bluetooth, Global Navigation Satellite Systems (GNSS), Near Field Communication (NFC), Wireless Gigibit Alliance (WiGig). Wireless Wide Area Network (WWAN), and Solid State Devices (SSD) modules. In addition, PCI Express (PCIe), Serial ATA (SATA), and Universal Serial Bus (USB) 3.0 may be routed to the M.2 interface, thereby enabling M.2 to provide more flexibility and functionality than prior solutions. This is beneficial as the computing industry continues to trend toward lighter and thinner platforms.

BRIEF DESCRIPTION OF THE DRAWINGS

Examples are described in the following detailed description and in reference to the drawings, in which.

NOTATION AND NOMENCLATURE

Figure 1:
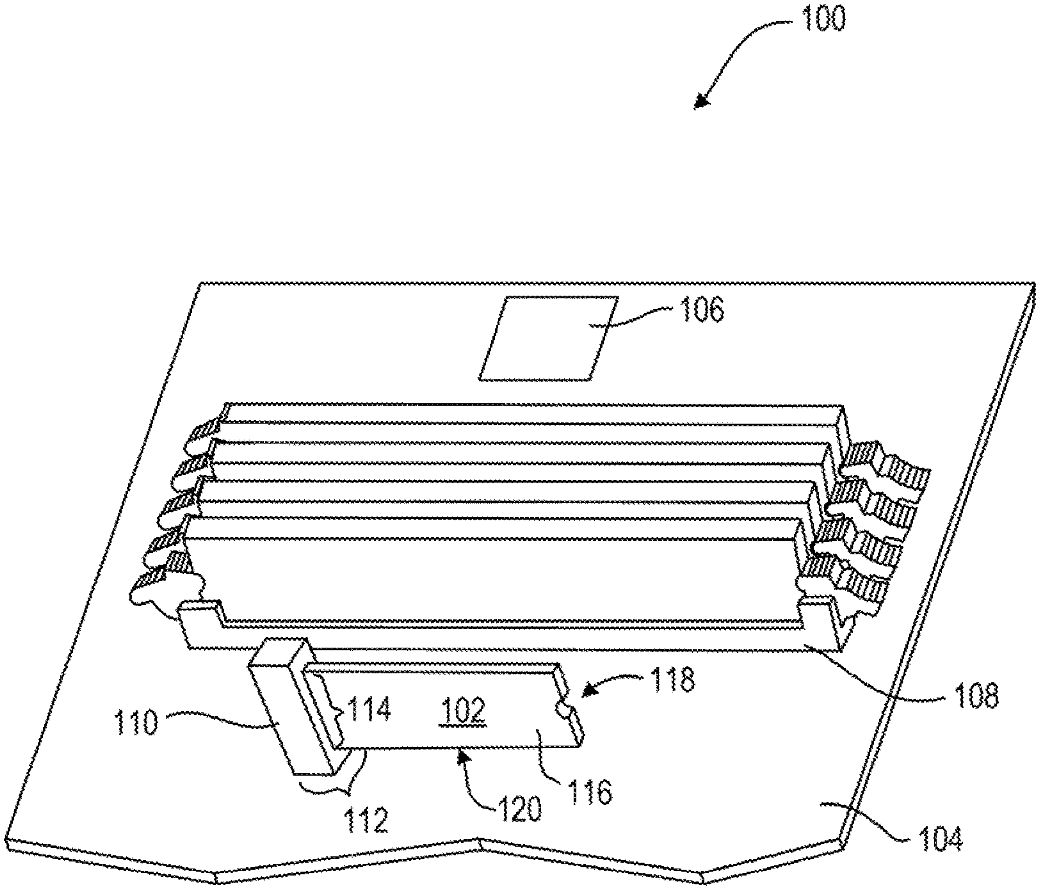
FIG. 1 depicts an example system with a M.2 module installed in an "vertical sideways" orientation in accordance with an implementation of the present disclosure.

Certain terms are used throughout the following description and claims to refer to particular system components. As one skilled in the art will appreciate, computer companies may refer to components by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct electrical or mechanical connection, through an indirect electrical or mechanical connection via other devices and connections, through an optical electrical connection, or through a wireless electrical connection. As used herein the term "approximately" means plus or minus 10%. In addition, the terms "M.2" and "NGFF" may be used interchangeably throughout the present disclosure and should be understood to referring to the same computing interface. Furthermore, the term "vertical" is intended to mean upright and approximately perpendicular to the plane of the horizon. The term "horizontal" is intended to mean approximately parallel to the plane of the horizon. The term "front surface" of the module is intended to refer to the primary face of the module where the majority of components are placed. The term "rear surface" is intended to refer to the face opposite the front surface that may or may not include components thereon. The term "upright orientation" is intended to mean that the module is positioned vertically with a side/edge surface facing a printed circuit board (PCB), and thus neither the front surface nor rear surface substantially faces the PCB.

DETAILED DESCRIPTION

The following discussion is directed to various examples of the disclosure. Although one or more of these examples may be preferred, the examples disclosed should not be interpreted, or otherwise used, as limiting the scope of the disclosure, including the claims. In addition, one skilled in the art will understand that the following description has broad application, and the discussion of any example is meant only to be descriptive of that example, and not intended to intimate that the scope of the disclosure, including the claims, is limited to that example.

As described above. M.2 is a new interface technology that is ideal for various applications. Among other benefits, the interface technology is more flexible and physically smaller than earlier interface technologies. This flexibility is beneficial because it enables complex management of PCIe. SATA, and/or USS devices. The physical size is a benefit because computing devices such as desktops are trending towards thinner, lighter, and smaller form factors (e.g., mini desktops and all-in-one (AiOs) desktops), and therefore space on the printed circuit board (PCB) and/or within the chassis is at a premium.

While various M.2 benefits are currently being realized, additional benefits may be realized by utilizing the novel and previously unforeseen implementation architecture described throughout the present disclosure. In particular, in current systems utilizing an M.2 interface, an M.2 connector component is placed on the motherboard PCB to receive the M.2 module in a flat manner such that either the front surface or rear surface of the M.2 module faces the PCB. That is, the M.2 module and the PCB are arranged in two parallel planes. In order to retain the M.2 module in this fiat position, an attachment screw is inserted at the non-connector end of the M.2 module to hold the M.2 module down to the PCB. Hence, the M.2 module lays fiat on the PCB, and on one end, couples to a connector component arranged to receive the M.2 module in the flat orientation, and on the other end, an attachment screw is inserted into a cutout on the M.2 module to hold the module down on the PCB.

While the above-described installation approach is appropriate for many applications, in some applications, this approach may not be optimal. In particular, because M.2 modules generally have rectangular dimensions of 22 mm×30 mm, 22 mm×42 mm, 22 mm×60 mm, 22 mm×80 mm, and 22 mm×110 mm, orienting the M.2 module flat on the system board takes significant. PCB real-estate that could be used for other system components and/or other M.2 modules. Moreover, because the M.2 module length can vary from 30 mm to 110 mm, and because attachment screws are utilized at one end, the system board designer needs to design the PCB with one M.2 module length in mind. As a result, it is difficult or even impossible to utilize an M.2 module with a different length after the PCB design is finalized without altering the system board's signal and/or power plane routing and component placement.

Aspects of the present disclosure attempt to address at least the above-mentioned issues by providing a universal M.2 connector solution that potentially decreases the connector/moduie PCB footprint, accommodates different length M.2 modules without requiring PCB redesign, accommodates multiple M.2 modules in a space typically taken by one M.2 module, reduces component count by eliminating attachment screws, and/or reduces manufacturing costs by eliminating attachment screws.

The universal M.2 connector solution utilizes a connector component to receive the M.2 module in an upright orientation such that neither the front surface nor the rear surface of the M.2 module substantially faces the PCB. In addition, the connector component includes an integrated retention mechanism to retain the M.2 module in the upright orientation without a retention mechanism external to the connector (e.g., without an attachment screw on one end of the M.2 module).

In one example in accordance with the present disclosure, a computing system is provided. The computing system may be, for example, a desktop, workstation, laptop, scientific instrument, gaming device, tablet, AiO desktop, television, hybrid laptop, detachable tablet/laptop, server, retail point of sale, or a similar computing system. The computing system comprises a PCB, a connector component coupled to the PCB, and a M.2 module coupled to the connector component The M.2 module is coupled to the connector component in an upright orientation such that neither a front surface nor a rear surface of the M.2 module substantially faces the printed circuit board, and the M.2 module is coupled to the connector component in the upright orientation without a retention mechanism external to the connector component. The connector component may receive and retain any size M.2 module length (e.g., 22 mm×30 mm, 22 mm×42 mm, 22 mm×60 mm, 22 mm×80 mm, and 22 mm×110 mm). Further, the connector component, depending on implementation, may receive the M.2 module in either a "vertical sideways" (see, e.g., FIGS. 1-3) or a "vertical upwards" (see, e.g., FIG. 4-6) orientation.

In one example implementation, the connector component receives and retains the M.2 module in the upright orientation based on only a friction force between the connector component and the M.2 module. In another example implementation, the connector component receives and retains the M.2 module in the upright orientation based at least in part on a pair of clamps integrated with the connector component. In yet another example implementation, the connector component receives and retains the M.2 module in the upright orientation based at least in part on a locking mechanism integrated into the connector component.

Furthermore, in some examples, traces internal to the connector component connecting a first connector portion to a second connector portion are length matched to provide optimum timing margins and/or to prevent electromagnetic interference (EMI). These and other example implementations are discussed further below with reference to various examples and figures.

FIG. 1 depicts an example system 100 with a M.2 module 102 installed in a "vertical sideways" orientation. As mentioned, the system 100 may be, for example, a computing device such as a desktop, workstation, scientific instrument, laptop, gaming device, tablet, AiO desktop, television, hybrid laptop, detachable tablet, server, retail point of sale, or another similar computing system. A system motherboard comprising a PCB 104 may be included within the system 100, The PCB 104 may have a plurality of components coupled thereto. Such component may include a processor 106 and memory slots 108, to name a few. in addition, a connector component 110 may be mounted on the PCB 104. The interfaces of the connector component 110 may be oriented in an "L-shape" such that a first connector portion 112 (i.e., the connector portion connecting to the PCB 104) is substantially parallel' to the PCB 104, and a second connector portion 114 (i.e., the connector portion receiving the M.2 module 102) is substantially perpendicular to the PCB 104. Stated differently, the second connector portion 114 (i.e., the connector portion receiving the M.2 module 102) is substantially perpendicular to the first connector portion 114 (i.e., the connector portion connecting to the PCB 104). This connector component 110 configuration may enable the M.2 module 102 to be retained in a "vertical sideways" manner such that minimal PCB real estate is taken by the connector 110 and the M.2 module 102. More precisely, neither the front surface of the M.2 module 116 nor the rear surface of the M.2 module 118 (not visible) substantially faces the PCB 104 when installed, and rather, a slim side surface of the M.2 module 120 (not visible) faces the PCB 104. Note that while FIG. 1 shows a space between the M.2 module 102 and the PCB 104 when installed, this space may not be present depending on the specific implementation.

Within the connector component 110, traces may be length matched to provide optimum timing margins and/or to prevent electromagnetic interference (EMI). This length matching may be achieved, for example, by including a PCB within the connector 110 and routing the traces such that the length of each trace from one side of the connector to the other side of the connector is the same. In another implementation. a PCB is not used internal to the connector component 110, and instead the wires or other mediums used to transfer the signals from one side of the connector to the other side of the connector are the same length.

As mentioned, the component connector 110 is to retain the M.2 module without attachment screws. This may be accomplished via a friction force, a pair of integrated clamps, an internal locking mechanism, and/or another integrated retention mechanism. With regard to the friction force implementation, an example uses interference fit technology also known as press fit of friction fit technology) to fasten the internal connector contacts to the M.2 module. That is, a frictional force between the contacts and M.2 module fastens the two together without the need for additional fasteners. With regard to the pair of integrated damps implementation, a damp may be located on each side of the connector 110, and these clamps may disengage from the M.2 module when pressed, and engage the side of the M.2 module when released. With regard to the internal locking mechanism implementation, an example uses clips/clamps internal to the connector 110 to engage upon insertion of the M.2 module 102, and disengage if the M.2 module 102 is pulled with a force beyond a threshold and/or disengage if a release button/tab on the connector 110 is depressed. In another example, the connector 110 may utilize a zero insertion force (ZIF) arrangement where a lever or, slider on the connector may be moved in one direction to engage the connector contacts with the M.2 module 102, and moved in the other direction to disengage the connector contacts from the M.2 module 102.

Figure 2:
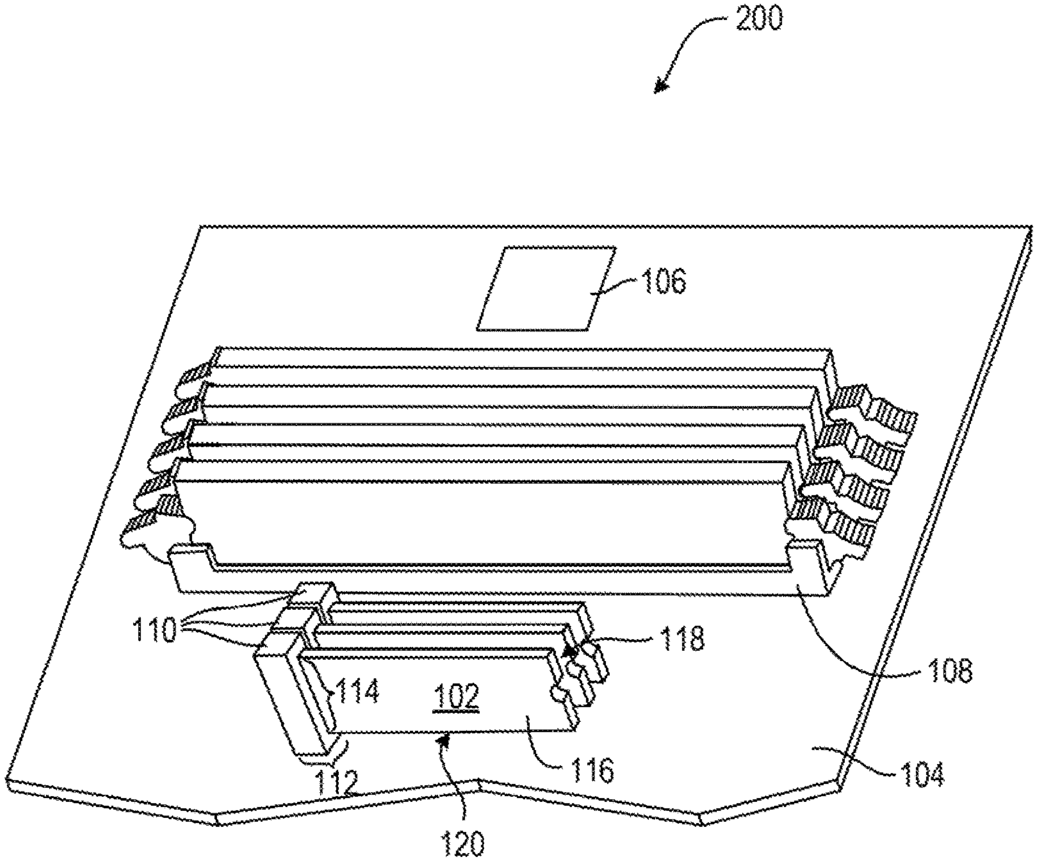
FIG. 2 depicts an example system with a plurality of same size M.2 modules installed in an "vertical sideways" orientation in accordance with an implementation of the present disclosure.

Turning, now to FIG. 2, this figure depicts a similar arrangement as shown in FIG. 1, but the system 200 comprises a plurality of connector components 110 and M.2 modules 102 adjacent to each other on the PCB 104. The M.2 modules 102 are the same dimensions, and the configuration enables the plurality of M.2 modules 102 to be retained in a "vertical sideways" manner such that minimal PCB 104 real estate is taken by the connectors 110 and M.2 modules 102. This provides a dramatic savings in PCB real estate when compared with conventional approaches that lay the M.2 module 102 flat on the PCB 104 such that the front surface 116 or the rear surface 118 (not visible) of the M.2 module 102 faces the PCB 104. Put another way, this architecture may enable two or more connectors 110 and associated M.2 modules 102 to be placed in the PCB area previously taken up by a single M.2 module 102 and connector 110 under conventional mounting approaches. Similar to FIG. 1, each connector 110 may retain the M.2 module 102 via friction force, a pair of integrated clamps, and/or an internal locking mechanism, and this configuration enables the M.2 module 102 to be retained without attachment screws like in conventional approaches.

It should be understood that while FIG. 2 depicts three separate and adjacent connectors 110, in some implementations, a plurality of connectors 110 may be integrated into a single connector with a plurality of first connector portions 112 and/or second connector portions 114 to receive a plurality of M.2 modules 102.

Figure 3:
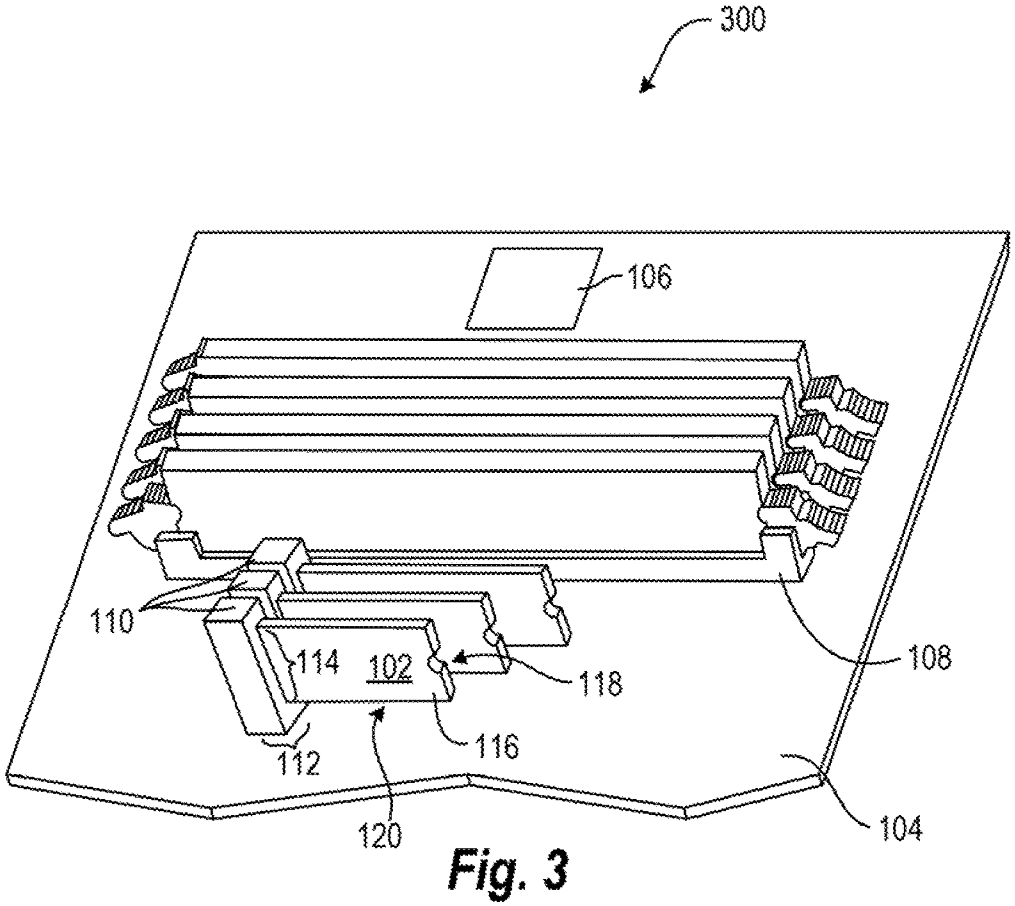
FIG. 3 depicts an example system with a plurality of different size M.2 modules installed in an "vertical sideways" orientation in accordance with an implementation of the present disclosure.

Looking now at FIG. 3, this figure depicts a similar arrangement as shown in FIG. 2, but the system 300 comprises a plurality of connector components 110 and different size M.2 modules 102 adjacent to each other on the PCB 104. The connectors 110 are universal and therefore retain different size M.2 modules 102 without attachment screws. For example, the second connector portion 114 is to receive and retain each of the following M.2 form factor module sizes without a retention mechanism external to the connector component: 22 mm×30 mm, 22 mm×42 mm, 22 mm×60 mm, 22 mm×80 mm. and 22 mm×110 mm. This is a benefit to system board designers because the designer does not have to account for attachment screw locations, and therefore the designer may place a connector 110 on one portion of the PCB 104 and have the ability to change the M.2 module size without drastically changing the board layout, routing, and/or component placement. This is possible because the M.2 modules are positioned in an "vertical sideways" manner where only a limited amount of the M.2 module 102 faces the PCB 120 (i.e., only the side portion 120 (not visible) of the M.2 module faces the PCB 104).

Figure 4:
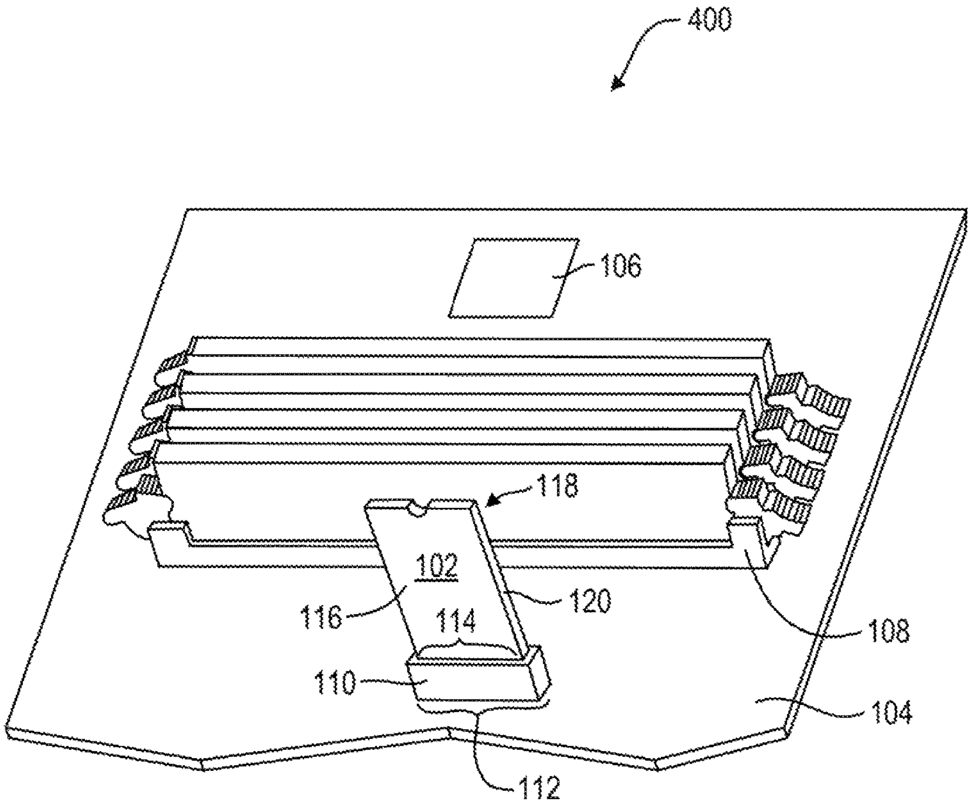
FIG. 4 depicts an example system with a M.2 module installed in an "vertical upwards" orientation in accordance with an implementation of the present disclosure.

Turning to FIG. 4, this figure depicts a system 400 with an alternate implementation in accordance with an aspect of the present disclosure where the M.2 module 102 is installed in a "vertical upwards" orientation. Similar to FIGS. 1-3, the arrangement retains the M.2 module 102 in an upright orientation such that neither the front surface 116 nor the rear surface 118 of the M.2 module substantially faces the printed circuit board 104. Unlike FIGS. 1-3, however, the M.2 module is installed upwards instead of sideways. This is accomplished by utilizing a connector 110 where, when the connector component 110 is coupled with the PCB 104, a first connector portion 112 (i.e., the connector portion connecting to the PCB 104) is substantially parallel to the PCB 104, and a second connector portion 114 (i.e., the connector portion receiving the M.2 module 102) is substantially parallel to the PCB 104. Put another way, the second connector portion 114 is substantially parallel to the first connector portion 112 in this arrangement. Similar to FIG. 1-3, the M.2 module 102 is retained via a friction force, a pair of integrated clamps, an internal locking mechanism, and/or another integrated retention mechanism, and therefore does not require attachment screws like in conventional M.2 module mounting approaches.

Figure 5:
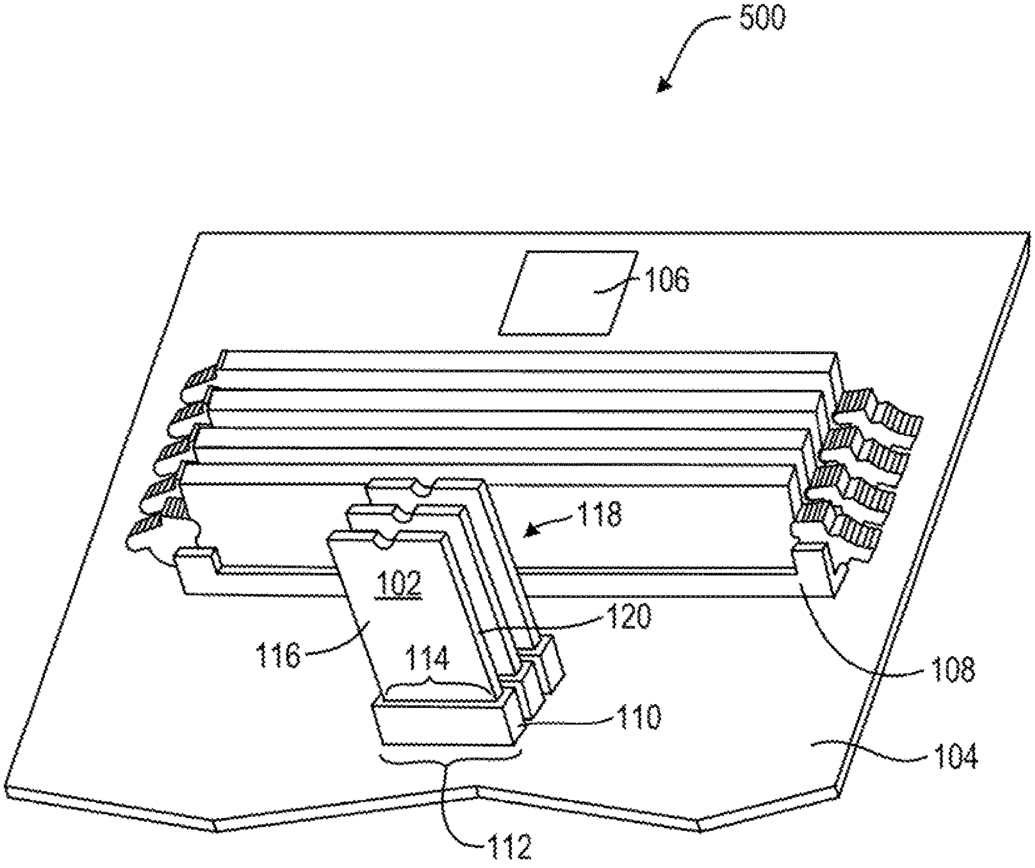
FIG. 5 depicts an example system with a plurality of same size M.2 modules installed in an "vertical upwards" orientation in accordance with an implementation of the present disclosure.

Looking now at FIG. 5, this figure depicts a system 500 with a similar arrangement as shown in FIG. 4, but the system 500 comprises a plurality of connector components 110 and M.2 modules 102 adjacent to each other on the PCB 104. The M.2 modules 102 are the same dimensions, and the configuration enables the plurality of M.2 modules 102 to be retained in a "vertical upright" manner such that minimal PCB real estate is taken by the connectors 110 and M.2 modules 102. This provides a savings in PCB real estate when compared with conventional approaches that lay the M.2 module 102 flat such that the front surface 116 or the rear surface 118 of the M.2 module 102 faces the PCB 104. Put another way, this architecture may enable two or more connectors 110 and associated M.2 modules 102 to be placed in the PCB area previously taken up by a single M.2 module and connector under conventional mounting approaches. Similar to FIG. 4, each connector 110 may retain the M.2 module 102 via friction force, a pair of integrated clamps, and/or an internal locking mechanism, and this configuration enables the M.2 module 102 to be retained without attachment screws like in conventional approaches.

Figure 6:
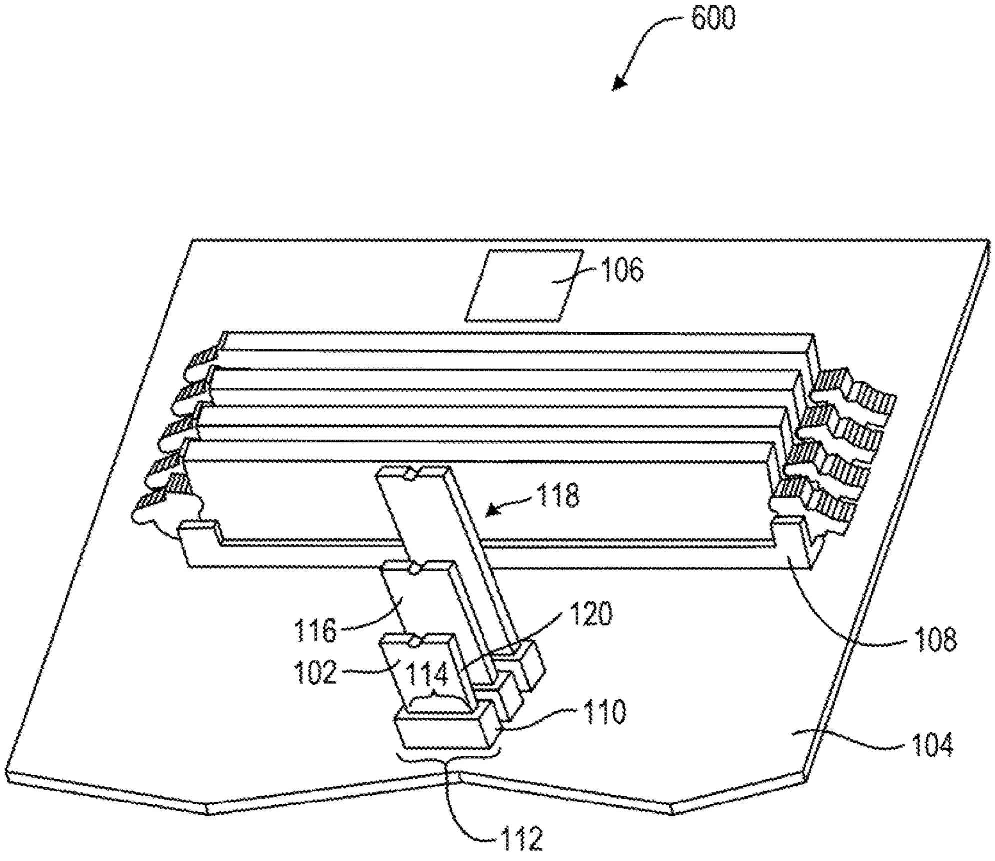
FIG. 6 depicts an example system with a plurality of different size M.2 modules installed in a "vertical upwards" orientation in accordance with an implementation of the present disclosure.

Looking now at FIG. 6, this figure depicts a similar arrangement as shown in FIG. 5, but the system 600 comprises a plurality of, connector components 110 and different size M.2 modules 102 adjacent to each other on the PCB 104. The connectors 110 are universal and therefore retain different size M.2 modules 102 without attachment screws. For example, the second connector portion 114 is to receive and retain each of the following M.2 form factor module sizes without a retention mechanism external to the connector component: 22 mm×30 mm, 22 mm×42 mm, 22 mm×60 mm, 22 mm×80 mm, and 22 mm×110 mm. This is a benefit to system board designers because the designer does not have to account for attachment screw locations, and therefore the designer may place a connector 110 on one portion of the PCB 104 and have the ability to change the M.2 module size without drastically changing the board layout, routing, and/or component placement. This is possible because the M.2 modules are positioned in a "vertical upright" manner where only a limited amount of the M.2 module 102 faces the PCB 104.

Figure 7:
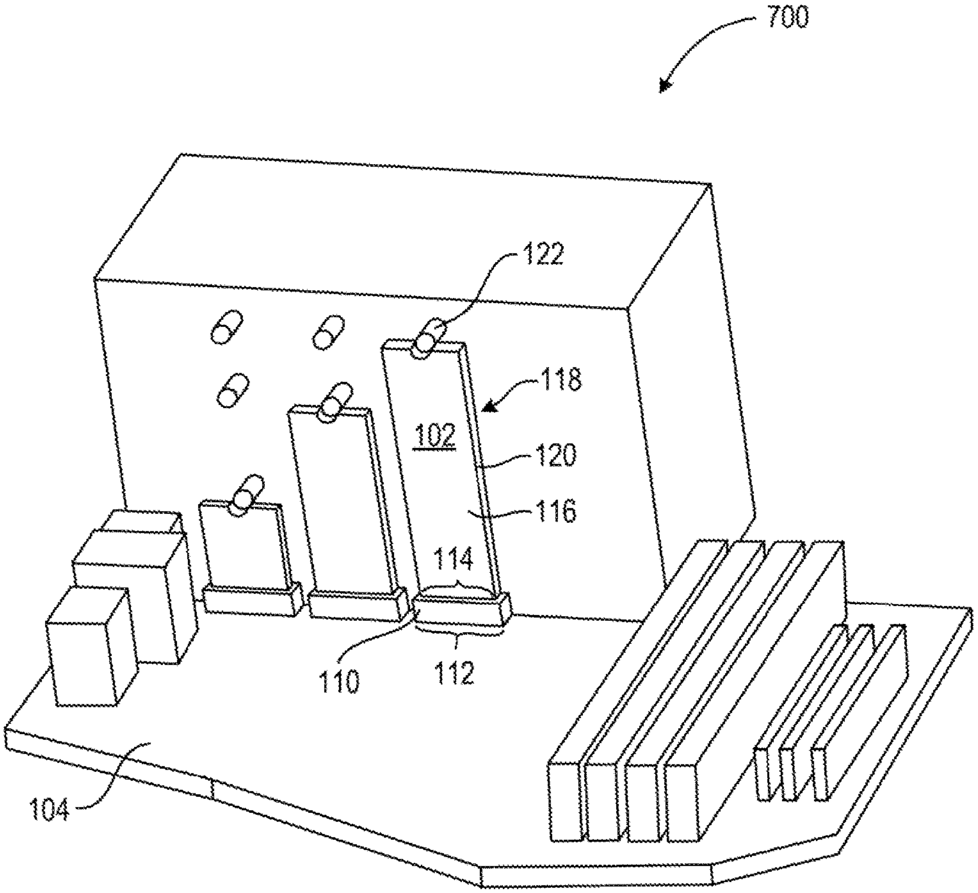
FIG. 7 depicts an example system with a plurality of different size M.2 modules installed in a "vertical upwards" orientation with additional retention mechanisms in place in accordance with an implementation of the present disclosure.

As mentioned above, while FIG. 6 depicts three separate and adjacent connectors 110, in some implementations, a plurality of connectors 110 may be integrated into a single connector with a plurality of first connector portions 112 and/or second connector portions 114 to receive a plurality of M.2 modules 102, Turning now to FIG. 7, this figure depicts yet another implementation where the system 700 utilizes the "vertical upwards" orientation described above with respect to FIGS. 4-7, but to provide additional retention strength (e.g., for systems that will incur increased movement, shaking, and/or vibration), the connector 110 and M.2 module 102 are placed adjacent to another system component (e g., a power supply) and retention mechanisms 122 such as posts or screws are used to couple with the slots in the M.2 module. Thus, in addition to the support provided by the above-described friction force, pair of integrated clamps, and/or internal locking mechanism, additional support is provided by retention mechanisms 122 coupled to a system component (e.g., a power supply). This may be beneficial for systems that undergo a significant amount of movement and therefore are subject to increased movement, shaking, and/or vibration.

While the above disclosure has been shown and described with reference to the foregoing examples, it should be understood that other forms, details, and implementations may be made without departing from the spirit and scope of the disclosure that is defined in the following claims.

What is claimed is:

1. A connector system, comprising:

a connector component including a first connector portion and a second connector portion, the first connector portion comprising a plurality of contacts to couple with a printed circuit board, and the second connector portion comprising a plurality of contacts to couple with a first end of a M.2 form factor module; and a retention mechanism mounted on a system component, the retention mechanism to retain a second end of the M.2 form factor module, the retention mechanism positioned directly above the connector component along an axis that extends perpendicularly from a planar surface of the printed circuit board, wherein the system component is fixedly coupled directly to the printed circuit board, wherein the retention mechanism comprises at least one selected from an attachment screw and a retaining post;

wherein the second connector portion is to receive the M.2 form factor module in an upright orientation such that neither a front surface nor a rear surface of the M.2 form factor module substantially faces the planar surface of the printed circuit board, wherein the system component is adjacent to the connector component on the printed circuit board;

wherein the system component is a power supply.

2. The connector system of claim 1, comprising:

a plurality of connector components including the connector component; and a plurality of retention mechanisms including the retention mechanism, wherein each of the plurality of retention mechanisms is disposed on a single side of the system component, wherein each of the plurality of retention mechanisms is positioned at a unique distance directly above a corresponding one of the plurality of connector components.

3. The connector system of claim 2, wherein the plurality of retention mechanisms are to retain each of the following M.2 form factor module sizes: 22 mm×30 mm, 22 mm×42 mm, 22 mm×60 mm, 22 mm×80 mm, and 22 mm×110 mm.

4. The connector system of claim 1, wherein the retention mechanism comprises a retaining post projecting from the system component, wherein the M.2 form factor module comprises a recess disposed on an edge along the second end, and wherein the recess is to partially surround the retaining post.

5. The connector system of claim 1, wherein the first end and the second end are opposite ends of the M.2 form factor module, and wherein the retention mechanism is to retain an edge of the second end.

6. The connector system of claim 1, wherein the retention mechanism is not electrically coupled to the M.2 form factor module.

7. The connector system of claim 1, wherein, when the connector component is coupled with the printed circuit board, the first connector portion is substantially parallel to the printed circuit board and the second connector portion is substantially parallel to the printed circuit board.

8. The connector system of claim 1, wherein the system component comprises at least one electrical component.

9. A computing system, comprising:

a printed circuit board comprising a planar surface;

a connector component coupled to the printed circuit board;

a system component fixedly coupled directly to the printed circuit board;

a retention mechanism mounted on the system component, the retention mechanism positioned directly above the connector component along an axis that extends perpendicularly from the planar surface of the printed circuit board, wherein the retention mechanism comprises at least one selected from an attachment screw and a retaining post; and a M.2 form factor module coupled to the connector component and the retention mechanism, wherein the M.2 form factor module is coupled to the connector component and the retention mechanism in an upright orientation such that neither a front surface nor a rear surface of the M.2 form factor module substantially faces the planar surface of the printed circuit board, and wherein system component is adjacent to the connector component on the planar surface of the printed circuit board wherein the system component is a power supply of the computing system.

10. The computing system of claim 9, wherein the connector component is coupled to a first end of the M.2 form factor module, wherein the retention mechanism is coupled to an edge of a second end of the M.2 form factor module, and wherein the first end and the second end are opposite ends of the M.2 form factor module.

11. The computing system of claim 9, comprising:

a plurality of connector components including the connector component; and a plurality of retention mechanisms including the retention mechanism, wherein each of the plurality of retention mechanisms is disposed on a single side of the system component, wherein each of the plurality of retention mechanisms is positioned at a unique distance directly above a corresponding one of the plurality of connector components.

12. The computing system of claim 11, wherein traces internal to the connector component connecting the first connector portion to the second connector portion are length matched.

13. The computing system of claim 9, wherein the retention mechanism is not electrically coupled to the M.2 form factor module.

14. The computing system of claim 9, wherein the system component comprises at least one electrical component.

15. A computing system, comprising:

a printed circuit board comprising a planar surface;

a plurality of connector components adjacent to each other and each coupled to the printed circuit board;

a system component fixedly coupled directly to the printed circuit board;

a plurality of retention mechanisms mounted on the system component, each of the plurality of retention mechanisms positioned directly above a corresponding one of the plurality of connector components along an axis that extends perpendicularly from the planar surface of the printed circuit board, wherein each of the plurality of retention mechanisms comprises at least one selected from an attachment screw and a retaining post; and a plurality of M.2 form factor modules each coupled to one of the plurality of connector components and to one of the plurality of retention mechanisms, wherein each of the plurality of M.2 form factor modules is coupled to one of the plurality of connector components and to one of the plurality of retention mechanisms in an upright orientation such that neither a front surface nor a rear surface of each of the plurality of M.2 form factor modules substantially faces the planar surface of the printed circuit board, wherein the system component is adjacent to the connector component, and wherein each of the plurality of connector components comprises a first connector portion and a second connector portion, and the first connector portion is substantially parallel to the printed circuit board and the second connector portion is substantially parallel to the printed circuit board;

wherein the system component is a power supply of the computing system.

16. The computing system of claim 15, wherein each of the plurality of retention mechanisms is disposed on one side of the system component.

17. The computing system of claim 15, wherein each of the plurality of M.2 form factor modules comprises a first end and a second end, wherein the first end and the second end are opposite ends, and wherein the retention mechanism is to retain an edge of the second end.

18. The computing system of claim 15, wherein the plurality of retention mechanisms are not electrically coupled to the plurality of M.2 form factor modules.

* * * * *